United States Patent [19]
Rolandi

[11] Patent Number: 6,115,801
[45] Date of Patent: Sep. 5, 2000

[54] DEVICE AND METHOD FOR INCREASING THE INTERNAL ADDRESS OF A MEMORY DEVICE USING MULTIFUNCTIONAL TERMINALS

[75] Inventor: Paolo Rolandi, Voghera, Italy

[73] Assignee: SGS-Thomson Microelectronics, S.r.l., Agrate Brianza, Italy

[21] Appl. No.: 09/049,858

[22] Filed: Mar. 27, 1998

[30] Foreign Application Priority Data

Mar. 28, 1997 [EP] European Pat. Off. .............. 97830151

[51] Int. Cl.[7] ...................................................... G06F 12/00
[52] U.S. Cl. ........................... 711/202; 711/220; 365/233
[58] Field of Search ................................. 711/220, 202, 711/163; 713/600; 365/233

[56] References Cited

U.S. PATENT DOCUMENTS

| | | | |
|---|---|---|---|
| 4,217,638 | 8/1980 | Namimoto et al. ..................... | 711/220 |
| 4,296,468 | 10/1981 | Bandoh et al. ......................... | 711/202 |
| 4,754,435 | 6/1988 | Takamatsu ......................... | 365/230.03 |
| 5,386,523 | 1/1995 | Crook et al. ............................. | 711/220 |
| 5,465,237 | 11/1995 | Chen et al. ............................. | 365/233 |
| 5,508,650 | 4/1996 | Grimm et al. .......................... | 327/365 |
| 5,537,353 | 7/1996 | Rao et al. ......................... | 365/189.02 |
| 5,613,094 | 3/1997 | Khan et al. ....................... | 395/500.44 |
| 5,729,504 | 3/1998 | Cowles .................................... | 365/236 |

*Primary Examiner*—Eddie P. Chan
*Assistant Examiner*—Hong Kim
*Attorney, Agent, or Firm*—Jenkens & Gilchrist, P.C.; Theodore E. Galanthay

[57] ABSTRACT

A semiconductor integrated, storage circuit device having at least a first enable terminal for enabling the device, and a first number of address terminals for inputting an external address formed of a corresponding first number of bits. The device comprises a plurality of data storage elements which are addressable by an internal address formed of a second number of bits larger than said first number, and further comprises address storage elements which are coupleable with their inputs to the first enable terminal for storing additional address bits. Thus, the internal address is comprised of the external address and the additional address bits.

22 Claims, 2 Drawing Sheets

DEVICE AND METHOD FOR INCREASING THE INTERNAL ADDRESS OF A MEMORY DEVICE USING MULTIFUNCTIONAL TERMINALS

FIELD OF THE INVENTION

This invention relates to a storage device integrated on a semiconductor and having multi-functional terminals.

BACKGROUND OF THE INVENTION

Integrated storage devices, commonly referred to as integrated memory circuits, have long been in use for a wide number of applications in electronics, and their information storage capacity is in constant increase.

This is one reason why the manufacturers of integrated circuits have recently reported on the occasion of technical meetings, and less frequently actually produced, devices which are designed for storing more than one element of binary information in each of their storage elements. See, for example, the article "A Multilevel-Cell 32 Mb Flash Memory," ISSCC95, Session 7, February 1995, Paper TA 7.7. Such devices are commonly referred to as multi-level memories.

Increased storage capacity brings about, inter alia, an increase in the number of terminals (pins) on the assembled component, particularly in the number of address-dedicated pins. Even a moderately expanded storage capacity, say a doubled capacity, which would merely involve the addition of one address pin, may instead result in a far larger package having to be used. For example, a standard 32-pin package may turn out to eventually include 40 pins.

In other fields of microelectronics, solutions have been adopted which provide multiplexed terminals, that is, if there are eight data-dedicated terminals in a processor, and the internal word length is of thirty two bits, a word may be supplied to the processor in four time-successive steps through these eight terminals. In addition, there are integrated memory circuits of the serial type, i.e. wherein all the binary information relating to a terminal function—usually data and/or addresses—goes through the terminal itself in timed succession. This is the case, for instance, with an integrated circuit ST24E16 from SGS-THOMSON MICROELECTRONICS. Such solutions allow the number of terminals to be considerably reduced, but are too elaborate for the aforementioned problem, are fairly complicated and, therefore, occupy a larger semiconductor die area

SUMMARY OF THE INVENTION

The object of the present invention is to solve the aforementioned problems.

Accordingly, the present invention provides a semiconductor integrated, storage circuit device having at least a first enable terminal for enabling the device and a first number of address terminals for inputting an external address formed of a corresponding first number of bits, comprising a plurality of data storage elements which are addressable by means of an internal address formed of a second number of bits, larger than the first number. The device further comprises address storage elements which are coupleable with their inputs to the first enable terminal for storing additional address bits, and wherein the internal address comprises the external address and the additional bits.

Additional objects, advantages, novel features of the present invention will become if apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The present invention will be more clearly understood by reference to the following description and the accompanying drawings, in which.

DETAILED DESCRIPTION OF A PREFERRED EMBODIMENT OF THE INVENTION

Generally, the present invention utilizes an enable terminal of a memory device to also input those address bits which cannot be accommodated by address terminals of the device.

Figure 1:
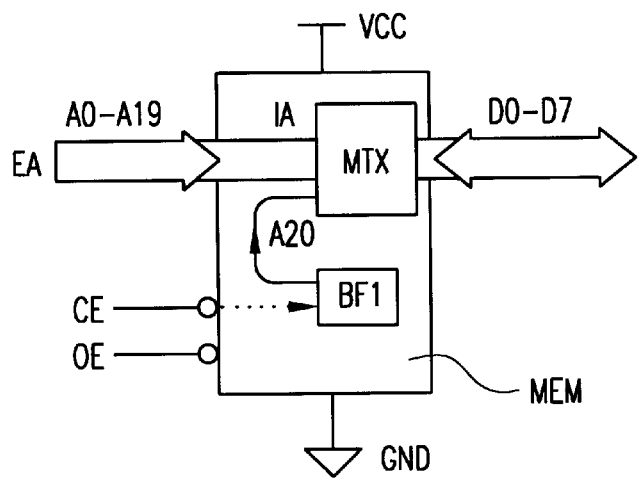
FIG. 1 is a block diagram of a memory circuit according to the present invention.

Referring to FIG. 1, a semiconductor integrated, storage circuit device MEM according to this invention has at least a first device-enable terminal and a first number of address terminals for inputting an external address EA. In the example of FIG. 1, which concerns a memory of the EPROM type, there are a low active chip-enable terminal CE, a low active output-enable terminal OE, 20 address terminals A0–A19, respectively, for 20 bits of the external address EA, and, of course, a power supply terminal VCC, a ground terminal GND, and a number of, eight in this example, data terminals D0–D7 for outputting and possibly inputting read data or data to be written. A device having such characteristics is, for example, an integrated circuit M27C80 from SGS-THOMSON MICROELECTRONICS.

The device of the present invention further comprises a plurality of data storage elements addressable by an internal address IA formed of a larger number of bits than the number of bits in the external address EA. In the example, the internal address IA is formed of 21 bits, denoted A0–A20. It also includes address storage elements BF1 coupleable to the first enable terminal, the terminal CE in the example, for inputting additional address bits to be stored up, the bit A20 in the example.

The internal address IA comprises the external address EA and the additional address bits. The address inputs of the matrix MTX are therefore connected to the address terminals A0–A19 of the device MEM and to the data output A20 of the (latched) storage buffer BF1. In order for the first enable terminal to be effectively used for two functions, the device includes control circuitry operative to couple this first enable terminal to the address storage elements as a result of a first predetermined recognizable electrical event, such as a voltage or current edge or pulse, at one of the enable terminals.

The number of additional bits may be more than one. In this case, a new bit would be stored for each new electrical event so that the control circuitry is to also record the number of stored bits, which increases its complexity. In order to have the operation of the memory device fully controlled, the control circuitry may be adapted for coupling the first enable terminal to the address storage elements upon the device being turned on or reset back on. Alternatively, the control circuitry may be adapted, upon the device power-on or reset-on, to store predetermined binary information into the address storage elements.

To bring the device back to normal operation and terminate the gathering of the additional address bit, the control circuitry may be adapted for decoupling the first enable terminal from the address storage elements on the occurrence of a second predetermined recognizable electrical event, either a voltage or current edge or pulse, at one of the enable terminals.

If the additional address bit is arranged to be gathered by the chip-enable terminal, for example, then the first electrical event may be provided either at the output-enable terminal or the chip-enable terminal, whereas the second electrical event is best provided at the output-enable terminal only, to avoid mistaking it for a change in the data relating to the additional bit.

Figure 2:
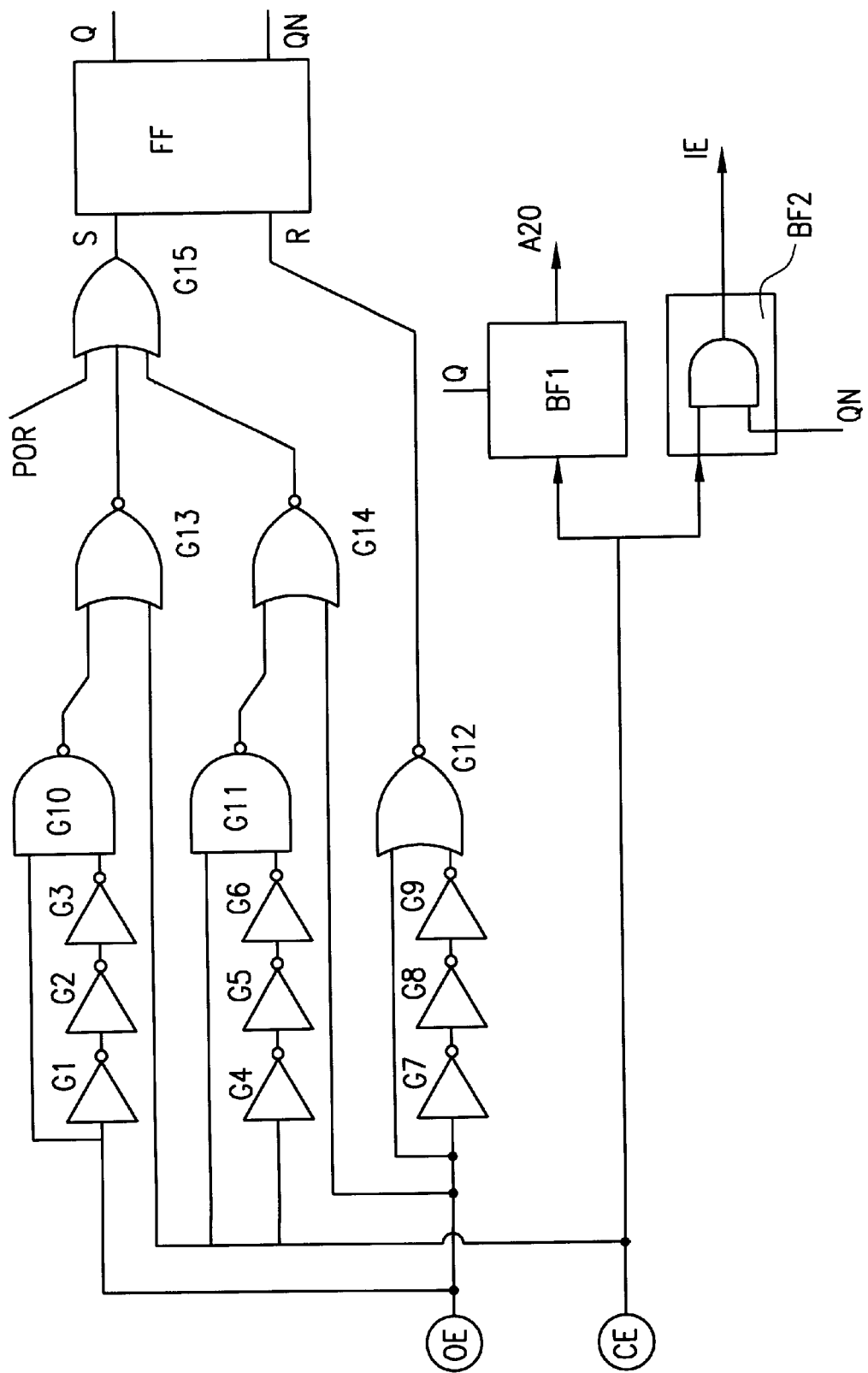
FIG. 2 is a circuit diagram of control circuitry which can be used in the device of FIG. 1.

In the embodiment of the control circuitry illustrated in FIG. 2, the chip-enable terminal CE and output-enable terminal OE are shown. The terminal OE is connected to the two inputs of a NAND gate G10, respectively directly and through a chain of three inverters G1, G2, G3 which function as an inverting delay element. The output of the gate G10 is connected to a first input of a NOR gate G13. The second input of the gate 13 is connected to the terminal CE. The terminal OE is also connected to the two inputs of a NOR gate G12, respectively directly and through a chain of three inverters G7, G8, G9 acting as an inverting delay element.

The terminal CE is connected to the two inputs of a NAND gate G11, respectively directly and through a chain of three inverters G4, G5, G6 acting as an inverting delay element. The output of the gate G11 is connected to a first input of a NOR gate G14. The second input of the gate G14 is connected to the terminal OE.

An OR gate G15 has three inputs respectively connected to the outputs of the gates G13 and G14 and to a power-on-reset signal POR. Many storage devices are provided with internal circuitry operative to generate a power-on-reset signal each time that the device is turned on or reset back on. Each time that the supply voltage drops below a given threshold for some time, the circuitry generates a positive voltage pulse having a predetermined duration.

A flip-flop FF of the SR type has a state output Q, a negated output QN, a set input S connected to the output of the gate G15, and a reset input R connected to the output of the gate G12.

The terminal CE is further connected to a first (latched) buffer BF1 with storage feature and to a second buffer BF2 without storage feature. The buffer BF1 has a control input provided to enable, when at a high logic level, connection between the input and output, which control input is connected to the output Q of the flip-flop FF. The buffer BF2 has a control input to enable, when at a high logic level, connection between the input and output, which control input is connected to the output QN of the flip-flop FF. The output of the buffer BF1 corresponds to the bit A20 of the internal address IA. The output of the buffer BF2 corresponds to an internal enable signal IE and should be connected to all those locations where the terminal CE would be connected conventionally.

Illustrated in FIG. 2 is, moreover, a very simple way of implementing the buffer BF2 acting on a negative logic input signal. The data input of the buffer is connected to a first input of an AND gate, the control input of the buffer is connected to a second input of the AND gate, the data output of the buffer is connected to the output of the AND gate. The storage buffer BF1 corresponds, for example, to the cascade connection of a nonstorage buffer and a storage element. The circuitry of FIG. 2 allows just one additional address bit A20 to be stored into the buffer BF1. The data relating to the additional address bit should be delivered on the chip-enable terminal CE at times to be explained.

The operation of the circuitry of FIG. 2 is readily analyzed. The gates G1, G2, G3, G10, G13 are effective to sense a leading edge of the signal presented at the terminal OE when the signal at the terminal CE is at a low logic level and to indicate it at the output of the gate G13 by means of a positive pulse whose duration is substantially same as the delay introduced by the gates G1, G2, G3. The gates G4, G5, G6, G11, G14 are effective to sense a leading edge of the signal presented at the terminal CE when the signal at the terminal OE is at a low logic level and to indicate at the output of the gate G13 by means of a positive pulse whose duration is substantially same as the delay introduced by the gates G4, G5, G6. The gate G15 is operative to transfer the pulses appearing at its inputs to the set terminal S of the flip-flop. Thus, if a rising edge occurs at the terminals CE or OE or there has been a power-on, the state of the flip-flop FF is set so that the output Q will go to a high logic level and the output QN to a logic low.

The signal at the terminal CE will then be delivered through the buffer BF1 to the matrix MTX and the additional address bit simultaneously stored into the buffer itself. On the other hand, the buffer BF2 will present at its output a signal at a low logic level, and accordingly, the portions of the storage device as are connected to its output will be enabled. In the alternative, the device could conceivably be kept disabled during the gathering of the additional address bit.

The gates G7, G8, G9, G12 are operative to sense a trailing edge of the signal presented at the terminal OE and to indicate it to the output of the gate G12 by means of a positive pulse having a duration equal to the delay introduced by the gates G7, G8, G9. With the output of the gate G12 connected to the reset terminal R of the flip-flop FF, such a pulse will cause the state of this flip-flop to be reset, whereby the output Q goes to a low logic level and the output QN goes to a high logic level.

The signal at the terminal CE, therefore, will be delivered through the buffer BF2 to the storage device interior as an internal enable signal IE. At the output of the buffer BF1, the logic slate stored in the buffer during the previous step will instead be presented as an additional address bit.

Figure 3A:
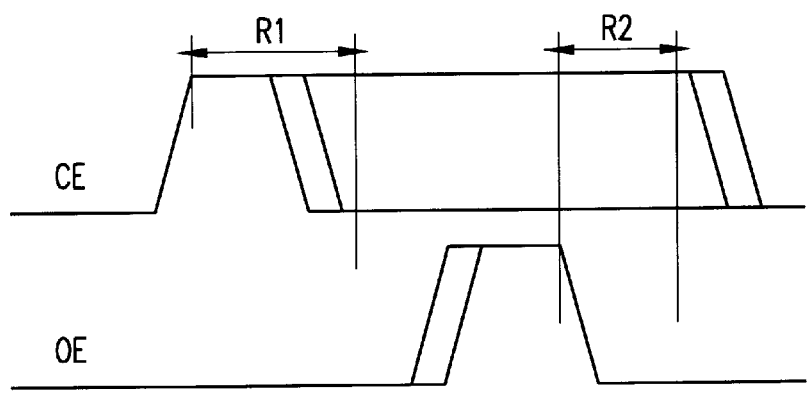
FIGS. 3A and 3B show timing diagrams for the signals at the enable terminals, under different conditions of operations of the circuitry in FIG. 2.

FIG. 3A shows the case where a leading edge of the signal at the terminal CE precedes a possible leading edge of the signal at the terminal OE. After a given delay R1, the buffer BF1 begins to gather the additional address bit from the terminal CE. This gathering step will end upon the occurrence of a trailing edge of the signal at the terminal OE after a delay R2.

Figure 3B:
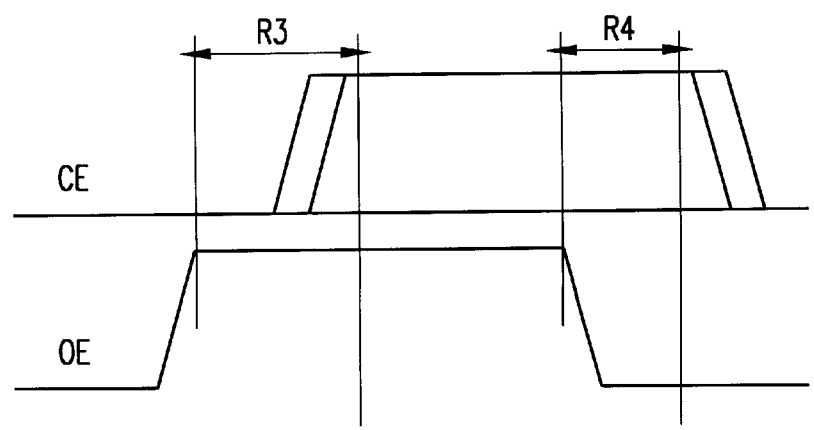

Illustrated in FIG. 3B is the instance of a leading edge of the signal at the terminal OE preceding a possible leading edge of the signal at the terminal CE. With a given delay R3, the buffer BF1 begins to gather in the additional address bit. This gathering step ends on the occurrence of a trailing edge of the signal at the terminal OE after a delay R4.

The embodiment shown in FIGS. 2, 3A and 3B has the advantage of being compatible with the existing mode of operation of storage devices which are not arranged for dual utilization of the enable terminals. The same holds for an embodiment similar to the above but having the functions of the chip-enable and output-enable terminals reversed.

With slight obvious modifications from the illustrated construction, two similar embodiments can be arrived at for the instance of "normal" rather than "negated" logic enable signals.

Throughout the above examples, the gathering of the additional address bit(s) is performed in an asynchronous manner: there are a gather start event and a gather end event. The gathering could be arranged to occur synchronously, however, although at the expense of slightly increased complexity due to well-known problems as associate with synchronous transmissions.

In this case, the device of this invention would comprise a control circuitry adapted to trigger a clocked transfer of a number of binary information elements corresponding to the number of additional bits from a selected enable terminal to the address storage elements in consequence of a predetermined recognizable electrical event, such as either a voltage or a current edge or pulse, at one of the enable terminals.

As previously discussed, the present invention can be useful where the storage capacity is to be increased two- or four-folds, for example, but the same package is to be used, or pin-to-pin compatibility is to be retained. This may be the case in moving from a conventional two-level storage device to a multi-level storage device.

Another application for which the present invention is specially useful concerns storage devices which have two modes of operation, e.g., a two-level mode and a four-level mode, according to the acceptable error rate for the application, or to the type of data to be stored. In this case, it is preferable for the number of additional bits to be equal to the logarithm to the base two of the largest number of binary information elements that each storage element in the plurality MTX can store.

The foregoing should not be construed to deny the possibility of using, instead of the enable terminals, other control terminals such as program and/or erase control terminals or terminals for auxiliary power supply such as program and/or erase voltages.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A circuit for a semiconductor integrated storage device, comprising:

a first enable terminal for enabling said semiconductor integrated storage device;

a second enable terminal for enabling output terminals of said semiconductor integrated storage device;

a first number of address terminals for inputting an external address formed of a corresponding first number of bits;

a plurality of data storage elements which are addressable by an internal address formed of a second number of bits, larger than said first number of bits; and address storage elements having input terminals which are coupleable to said first enable terminal for storing a value corresponding to said first enable terminal in a first of said address storage elements, an output of said first address storage element forming one or more additional address bits, said internal address comprises said external address and said one or more additional address bits, said value corresponding to said first enable terminal appears on said output of said first address storage element upon a first signal transition appearing on one of said first and said second enable terminals to a disabling state, said first address storage element latching said value corresponding to said first enable terminal upon a second signal transition appearing on said second enabling terminal to an enabling state.

2. The device according to claim 1, wherein:

said control circuitry further couples said first enable terminal to said output of said first address storage element as the semiconductor integrated storage device is powered up.

3. The device according to claim 1, wherein said control circuitry stores predetermined binary information into said address storage elements as the device is powered.

4. The device according to claim 1, wherein:

said control circuitry decouples said first enable terminal from said first address storage upon the occurrence of the second signal transition.

5. The device according to claim 1, wherein:

the number of said one or more of said additional address bits is one.

6. The device according to claim 1, wherein:

said first enable terminal is a chip-enable terminal.

7. The device according to claim 1, further comprising:

a control circuit for controlling a synchronous transfer of one or more binary information elements corresponding to the number of said additional bits to said address storage elements on the occurrence of said first signal transition.

8. The device according to claim 1, wherein:

the semiconductor integrated storage device is capable of storing a third number, greater than one, of binary information elements into each of said plurality of data storage elements.

9. The device according to claim 8, wherein:

the number of additional address bits is the logarithm to the base two of said third number.

10. A semiconductor memory device, comprising:

a plurality of address input terminals for receiving a first set of address signals;

a first control input terminal;

a second control input terminal;

control circuitry for generating a second set of one or more address signals, the second set of one or more address signals being based upon a state of the first control input terminal, the first set and second set of address signals forming an internal address bus; and an array of memory cells addressable by the internal address bus;

an output of the control circuitry generates the second set of the one or more address signals based upon a state of the second control input terminal, the control circuitry couples the signal appearing on the first control input terminal to an output of the control circuitry during a time period defined approximately between a leading edge of the signal appearing on one of the first control input terminal and the second control input terminal, and a trailing edge of the signal appearing on the second control input terminal.

11. The semiconductor memory device of claim 10, wherein:

the control circuitry includes a first storage element responsive to the leading edge of the signal appearing on one of the first control input terminal and the second control input terminal.

12. The semiconductor memory device of claim 11, wherein:

the control circuitry includes a second storage element responsive to an output of the first storage element, an output of the second storage element generating the second set of the one or more address signals.

13. The semiconductor memory device of claim 12, wherein:

the second storage element stores the state of the signal appearing on the first control input terminal based upon the output of the first storage element.

14. The semiconductor memory device of claim 11, wherein:

the control circuitry generates an enable signal based upon an output of the first storage element and upon a state of the first control input terminal.

15. The semiconductor memory device of claim 11, wherein:

the first storage element is responsive to a power-on-reset signal.

16. The semiconductor memory device of claim 10, wherein:

the control circuitry latches the state of the first control input terminal following the time period defined approximately between the leading edge of the signal appearing on one of the first control input terminal and the second control input terminal, and the trailing edge of the signal appearing on the second control input terminal.

17. The semiconductor memory device of claim 16, wherein:

the time period is defined between a first predetermined delay following the leading edge of the signal appearing on one of the first control input terminal and the second control input terminal, and a second predetermined time delay following the trailing edge of the signal appearing on the second control input terminal.

18. The semiconductor memory device of claim 10, wherein:

the first control input terminal receives a chip enable signal for enabling the semiconductor memory device.

19. The semiconductor memory device of claim 10, wherein:

the semiconductor memory device is selectively configurable so that each memory cell of the memory cell array is capable of storing various amounts of data; and the second set of the one or more address signals corresponds to a number of distinct memory cell storage configurations.

20. A method of generating an address for an array of memory cells in a semiconductor memory device, comprising the steps of:

receiving a first set of address signals;

receiving a first control input signal;

receiving a second control input signal;

generating a second set of one or more address signals based upon a state of the received first control input signal, including the steps of latching a state of the first control input terminal following a time period defined approximately between a leading edge of a signal appearing on one of the first control input terminal and the second control input terminal, and a trailing edge of a signal appearing on the second control input terminal, the latched state forming the second set of one or more address signals; and forming the address for the array of memory cells from the first set of address signals and the second set of the one or more address signals.

21. The method of claim 20, wherein:

the time period is defined between a first predetermined delay following the leading edge of the signal appearing on one of the first control input terminal and the second control input terminal, and a second predetermined time delay following the trailing edge of the signal appearing on the second control input terminal.

22. The method of claim 20, further including the step of:

generating an internal enable signal for the semiconductor device, the internal enable signal being in a state for disabling portions of the device during the defined time period.

* * * * *